(12) United States Patent
Herbst et al.

(10) Patent No.: US 6,582,888 B1
(45) Date of Patent: Jun. 24, 2003

(54) METHOD FOR PRODUCING ORGANIC ELECTROLUMINESCENT COMPONENTS

(75) Inventors: Waltraud Herbst, Uttenreuth (DE); Rainer Leuschner, Grossenseebach (DE); Ewald Günther, Chempaka Court (SG); Jürgen Simmerer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/173,499

(22) Filed: Oct. 15, 1998

(30) Foreign Application Priority Data

Oct. 15, 1997 (DE) .......................... 197 45 610

(51) Int. Cl.$^7$ ................................ G03F 7/00
(52) U.S. Cl. ................ 430/312; 430/315; 430/320; 430/324; 313/494; 313/504
(58) Field of Search ................ 430/312, 315, 430/320, 324; 313/494, 504

(56) References Cited

U.S. PATENT DOCUMENTS

| | | | | |
|---|---|---|---|---|
| 4,578,859 A | * | 4/1986 | Hause et al. ............ 29/578 |
| 4,806,453 A | * | 2/1989 | Vidusek ................ 430/312 |
| 5,022,968 A | * | 6/1991 | Lin et al. .............. 204/28 |
| 5,120,622 A | * | 6/1992 | Hanrahan ................ 430/7 |
| 5,276,380 A | | 1/1994 | Tang ................... 313/504 |
| 5,360,698 A | | 11/1994 | Hanrahan et al. ......... 430/324 |
| 5,701,055 A | * | 12/1997 | Nagayama ............... 315/504 |
| 5,863,823 A | * | 1/1999 | Burgener ............... 438/295 |
| 5,902,688 A | * | 5/1999 | Antoniadis ............. 428/690 |
| 5,953,587 A | * | 9/1999 | Forrest ................. 438/99 |
| 6,013,538 A | * | 1/2000 | Burrows ................ 438/22 |
| 6,037,712 A | * | 3/2000 | Codama ................. 313/498 |
| 6,060,728 A | * | 5/2000 | Ghosh ................... 257/93 |

FOREIGN PATENT DOCUMENTS

| | | |
|---|---|---|
| DE | 44 01 590 A1 | 7/1995 |
| EP | 0 341 843 A2 | 11/1989 |
| EP | 0 732 868 A1 | 9/1996 |

* cited by examiner

Primary Examiner—Mark F. Huff
Assistant Examiner—Nicole Barreca
(74) Attorney, Agent, or Firm—Laurence A. Greenberg; Werner H. Stemer; Ralph E. Locher

(57) ABSTRACT

A method for producing organic electroluminescent components having a structured electrode, in particular displays having a structured metal electrode, includes the following steps: At least two layers are applied onto a bottom electrode which is located on a substrate. The first layer is electrically insulating and is not damaged when the second layer is applied. A defined boundary remains between the two layers. The first layer has a higher solubility rate in a liquid developer than the second layer and it is possible to structure the second layer. The second layer is structured and the structure is transferred to the first layer. At least one organic functional layer is applied onto the second layer. A top electrode is deposited onto the organic functional layer.

37 Claims, 1 Drawing Sheet

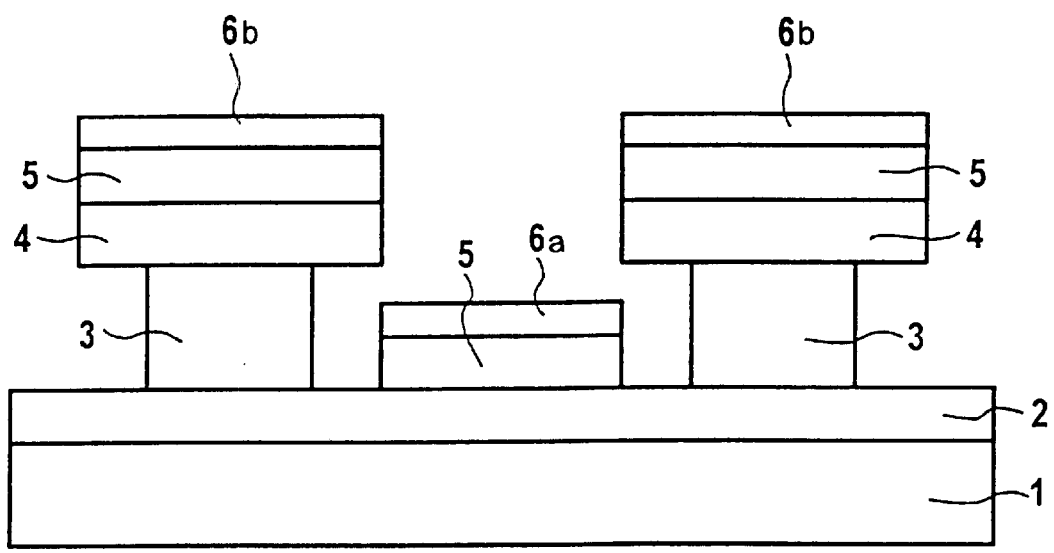

METHOD FOR PRODUCING ORGANIC ELECTROLUMINESCENT COMPONENTS

BACKGROUND OF THE INVENTION

FIELD OF THE INVENTION

The invention relates to a method for producing organic electroluminescent components having a structured electrode, in particular displays having a structured metal electrode.

With an increasing interchange of data and information, their visualization, particularly in communications technology terminals, is becoming ever more important. That information presentation normally takes place through the use of pixel matrix display apparatuses which may have additional, permanently specified symbol displays ("icons"). Known technologies of pixel matrix apparatuses are, for example, cathode ray tubes although, due to space requirement, electrical power consumption and weight, they are not suitable for use in mobile and portable electronic equipment. Flat screens ("flat panel displays") are considerably more suitable for that purpose and, nowadays, are predominantly based on liquid crystal display (LC display) technology.

Simple, monochrome, passive-matrix-operated LC displays offer the advantage of cost-effective producibility as well as low electrical power consumption, low weight and small space requirement. However, the use of such displays is also linked to serious disadvantages. Specifically, the displays are not self-emitting due to the technological/physical principle, that is to say they can only be read and identified reliably in particularly favorable ambient lighting conditions. A further major constraint is the severely limited viewing angle of the display.

The problem of the lack of contrast in ambient lighting conditions that are not optimal can admittedly be improved by additionally fitting back-lighting, but that improvement is linked to a number of disadvantages. For example, back-lighting greatly increases the thickness of the LC flat screen. Specifically, while LC displays without back-lighting can be manufactured with a thickness of <1 mm, the total thickness of back-lit LC displays is typically several millimeters. In addition to the lamps or fluorescent tubes, the light-conducting plastic ("diffuser") required for homogeneous illumination of the display area in particular contributes to increasing the thickness. A further major disadvantage of back-lighting is that the great majority of the electrical power consumption is required for the lighting. Furthermore, a higher voltage which is required to operate the light sources (lamps and fluorescent tubes), is normally produced with the aid of "voltage-up converters" from batteries or rechargeable batteries.

Active matrix LC displays can achieve better performance than with LC displays driven in the passive mode. In that case, each of the three primary colors in each pixel is assigned its own thin-film transistor (TFT). However, TFT technology is very costly and stringent requirements are placed on the substrates that are used, due to the high process temperatures that occur. The price for active matrix LC displays is correspondingly high.

The switching time of a single liquid crystal pixel is typically several milliseconds due to the physical principle of reorientation of a molecule in the electrical field, and furthermore is very highly temperature-dependent. The slow and delayed formation of the image, for example in traffic equipment (navigation systems in motor vehicles), thus has a particularly disturbing effect at low temperatures. LC technology can therefore be used only to a limited extent in the case of applications in which rapidly changing information and images are displayed, for example in video applications.

Other display technologies have either not yet reached the level of maturity for technical applicability, for example flat panel CRTs (CRT=cathode ray tube), or their use, particularly in portable electronic equipment, is subject to serious disadvantages resulting from specific characteristics: high operating voltage for vacuum fluorescence displays and inorganic thin-film electroluminescent displays, and high costs for displays based on inorganic light-emitting diodes.

Those disadvantages can be overcome by using displays based on organic light-emitting diodes (OLEDs). That new technology has a large number of advantages over LC displays, of which the major advantages are as follows:

Due to the principle of self-emissivity, there is no necessity for back-lighting, which considerably reduces the space requirement, power consumption and weight.

The typical switching times of pixels are in the order of magnitude of 1 $\mu$s and thus allow rapid image sequences to be displayed without any problems.

The switching times have no disturbing inertia at low temperatures.

The reading angle is considerably greater than in the case of LC displays, and is virtually 180°.

There is no need for the polarizers required for LC displays, so that increased brightness can be achieved even with a multiplexed display.

In contrast to other display technologies, organic light-emitting diodes can also be produced on flexible substrates and with non-planar geometries.

The production and layout of displays based on organic light-emitting diodes is much easier, and thus more cost-effective to achieve, than LC displays. Layout and production are typically carried out as follows.

The substrate, for example glass, is coated over the entire surface with a transparent electrode that is composed, for example, of indium tin oxide (ITO). Both the transparent electrode and the top electrode must be structured to produce pixel matrix displays. In that case, both electrodes are normally structured in the form of parallel conductor tracks, with the conductor tracks of the transparent electrode and top electrode running at right angles to one another. The structuring of the transparent electrode is carried out by a photolithographic process including wet-chemical etching methods, the details of which are known to the person skilled in the art. The resolution that can be achieved by using those methods is essentially limited by the photolithographic steps and the nature of the transparent electrode. Based on the prior art, both pixel sizes and non-emitting intermediate spaces between the pixels of a few micrometers in size can be achieved in that case. The length of the conductor tracks (which are in the form of strips) of the transparent electrode may be up to many centimeters. Depending on the lithography mask being used, emitting surfaces with a size of up to several square centimeters can also be produced. The sequence of the individual emitting surfaces may be regular (pixel matrix display) or variable (symbol displays).

One or more organic layers are applied to the substrate with the structured transparent electrode. Those organic layers may be composed of polymers, oligomers, low molecular-weight compounds or mixtures thereof. Liquid-phase processes (application of a solution through the use of spin coating or wiping) are normally used for applying polymers, for example polyanline, poly(p-phenylene-vinylene) and poly(2-methoxy-5-(2'-ethyl)-hexyloxy-p-phenylene-vinylene), while gas-phase deposition (vapor deposition or "physical vapor deposition", PVD) is preferred for low molecular-weight and oligomer compounds. Examples of low molecular-weight compounds, which preferably transport positive charge carriers, are: N,N'-bis-(3-methylphenyl)-N,N'-bis-(phenyl)-benzidine (m-TPD), 4,4', 4"-tris-(N-3-methylphenyl-N-phenylamino)triphenylamine (m-MTDATA) and 4,4',4"-tris-(carbazol-9-yl) triphenylamine (TCTA).

Hydroxyquinoline aluminum III salt (Alq) is used, for example, as an emitter, which can be doped with suitable chromophores (quinacridon derivatives, aromatic hydrocarbons etc.). Additional layers, which influence the electrooptical characteristics as well as the long-term characteristics, may also be present and may be composed, for example, of copper phthalocyanine. The total thickness of the layer sequence may be between 10 nm and 10 $\mu$m, typically being in the range between 50 and 200 nm.

The top electrode is normally composed of a metal, which is in general applied by gas-phase deposition (thermal evaporation, sputtering or electron beam evaporation). Base metals, which are therefore reactive in particular with water and oxygen, are preferably used, such as lithium, magnesium, aluminum and calcium as well as alloys of those metals with one another or with other metals. The structuring of the metal electrode required for producing a pixel matrix configuration is in general achieved by applying the metal using a shadowmask having appropriately shaped openings.

An OLED display which is produced in that way may include additional devices that influence the electrooptical characteristics, such as UV filters, polarization filters, anti-reflection coatings, devices known as "micro-cavities" as well as color-conversion and color-correction filters.

Furthermore, hermetic packaging is provided, through the use of which the organic electroluminescent displays are protected against environmental influences, such as moisture and mechanical stresses. In addition, thin-film transistors may be present in order to drive the individual pixels.

In the case of high-resolution displays, which make it possible to present a large amount of information, fine structuring of the metal electrode in the form of conductor tracks is required, that is to say both the width of the conductor tracks as well as the intermediate spaces must be capable of being structured in the $\mu$m range while maintaining tight tolerances. The width of a conductor track in that case may be between 10 $\mu$m and several hundred micrometers, preferably between 100 and 300 $\mu$m. In order to achieve a high filling factor (ratio of the active, light-emitting area to the total area of the display configuration), it is also necessary for the intermediate spaces between the metallic conductor tracks as well as the intermediate spaces between the conductor tracks of the transparent electrode to be only a few micrometers.

In order to produce structured metal electrodes, a metal layer can first of all be applied to the entire surface through the use of a gas-phase process, and that layer is then structured using photolithographic methods. However, that has the major disadvantage of possibly damaging the sensitive, organic functional layers, when those parts of the metal layer which are not required ("intermediate spaces") are removed. Such processes for defined removal of parts of the metal layer are, for example, lift-off processes and plasma etching. However, since even damage to or destruction of individual pixels leads to a considerable adverse effect, even to the extent of the entire display becoming unusable, reliable process control and thus a high yield in production cannot be achieved with those techniques. A further exacerbating factor is that the use of both aqueous and organic solvents for removal of a part of the metal layer, by destructive diffusion of the solvent into the organic functional layers, is only feasible to an extremely limited extent.

A further option for structuring of the metal electrode is selective deposit-on of the metal, for example in the form of conductor tracks, through the use of appropriately structured shadowmasks. Those shadowmasks may be produced from stainless steel or from glass which can be structured photolithographically. The intermediate spaces between individual conductor tracks in that case correspond on the side of the shadowmask to thin "webs", and the actual conductor tracks of the metal electrodes are deposited through appropriately shaped openings. Both for reasons of stability of the shadowmask and for production-engineering reasons during manufacture, web widths of <150 $\mu$m for stainless steel and <90 $\mu$m for glass cannot be produced reliably. A further exacerbating factor is that, during the process of depositing the metal, the distance between the substrate and the mask must be no more than a few micrometers, in order to ensure that the metallic structures have sharp edges. Furthermore, the shadowmask must not damage the organic functional layers by excessive contact pressure against the substrate. In addition, the production of non-planar organic light-emitting diodes on curved surfaces is made substantially more difficult as a result of those problems. A further problem with respect the producibility of organic LED displays using shadowmasks is that the substrate, with the organic functional layers, must be positioned reproducibly and with a high throughput (production of several thousand displays per day) to an accuracy of a few micrometers above the associated structures of the shadowmask. Furthermore, for geometric reasons, it is impossible to use shadowmasks to represent shapes or symbols in which a non-emitting area is completely enclosed by an emitting area, for example concentric circles.

U.S. Pat. No. 5,276,380 discloses electroluminescent displays in which vertical "walls" are disposed between the light-emitting pixel rows and overhang the organic electroluminescent medium. Such a construction has the disadvantage of not being suitable for producing symbols of any desired shape. In addition, the size of the individual pixels is limited by the height of the walls. Large-area displays therefore cannot be produced in that way.

SUMMARY OF THE INVENTION

It is accordingly an object of the invention to provide a method for producing organic electroluminescent components, which overcomes the hereinafore-mentioned disadvantages of the heretofore-known methods of this general type and which allows structured electrodes to be produced in organic electro-luminescent components in a manner that is suitable for manufacture, in particular the production of finely structured metallic top electrodes for high-resolution displays and for presentations that include finely structured details, in which case it is intended to be possible to simultaneously present separate symbols and information on the display area that is broken down into pixels.

With the foregoing and other objects in view there is provided, in accordance with the invention, a method for producing organic electroluminescent components having a structured electrode, in particular displays having a structured metal electrode, which comprises applying at least a first and a second layer onto a bottom electrode located on a substrate, with a defined boundary remaining between the first and second layers, the first layer being electrically insulating and not damaged when applying the second layer, the first layer having a higher solubility rate in a liquid developer than the second layer, and the second layer being able to be structured; structuring the second layer and transferring the structure to the first layer; applying at least one organic functional layer onto the second layer; and depositing a top electrode onto the organic functional layer.

The invention provides a novel method for producing organic electroluminescent components. This method allows the production of structured electrodes, such as metal electrodes, in particular for organic electroluminescent displays, without there being any risk of damage to the organic functional layers, as is the case with known processes. Furthermore, it is possible to dispense with the use of shadow masks, which are susceptible to faults, and the achievable resolution is considerably improved with respect to the lower limit and bandwidth.

The top electrode, which preferably has a low work function for electrons and thus functions as an electron-injecting electrode, is composed, in particular, of metal or a metallic alloy. However, this electrode may also have a layer structure, in which case a metal or ITO layer is disposed as a (transparent) electrode on a thin dielectric layer (<5 nm) that is composed, for example, of lithium fluoride or aluminum oxide.

The essential feature of the method according to the invention is that the first layer which is applied onto the bottom electrode (that can be structured), that is to say the lower layer, is not damaged when the second layer (upper layer) is applied, and a defined boundary is maintained between the two layers.

In accordance with another mode of the invention, the first and/or the second layer is or are advantageously composed of an organic film-forming material, preferably of a photoresist.

Photoresists are light-sensitive film-forming materials having a solubility behavior which changes as a result of illumination or irradiation in this case, a distinction is drawn between positive and negative photoresists. If, in the present case, both the upper layer and the lower layer are composed of a photoresist and if the two photoresists are sensitive in the same wavelength band, then the photoresist of the lower layer must not be a negatively operating system.

In accordance with a further mode of the invention, an essential feature of a preferred embodiment includes a photolithographic process in which at least two layers are applied to the transparent bottom electrode, possibly after it has been structured, the first layer of which is composed of a varnish or a positive photoresist and the second layer of which is composed of a positive or negative photoresist. In the case of a first layer composed of photoresist, that layer is floodlit before the application of the second layer. The layers are then structured in such a manner that the organic functional layers and the (metallic) top electrode can be applied or deposited over the area thereon. The structuring of the layers and of the top electrode in this case runs transversely with respect to the structuring of the bottom electrode. The application of the organic functional layer or layers onto the second layer in general can be carried out both through the use of a thermal evaporation process as well as from a solution, for example by centrifuging on or wiping, and subsequent drying.

In the case of the photolithographic method step, the following is important. It must be possible to coat over the first of the two layers ("overcoatable"). This means that the two layers can be applied one over the other without any so-called Intermixing, that is to say the varnishes which are used are soluble in different solvents, so that the "photoresist" varnish in the first layer is not attacked by the solvent for the photoresist in the second layer. This ensures that the defined structure of the first layer is retained when the second layer is applied, and that a defined boundary exists between the two layers.

It is also necessary with regard to the photolithographic method step, for the first layer to have a higher development rate than the second layer. This means that, when the developer solution is applied to the varnish layers for the treatment required, after exposure, for structuring, the first layer dissolves more quickly than the second layer. It is advantageous in this case if the two layers can be treated, that is to say developed, by using the same developer which is, in particular, an aqueous-alkaline developer.

In general, electrically insulating, organic or inorganic materials are used for the lower layer. Suitable inorganic materials are, for example, silicon dioxide, silicon nitride and aluminum oxide.

In accordance with an added mode of the invention, alternatively, the lower layer is composed of non-photosensitive polyimide which can be developed by alkaline techniques.

In accordance with an additional mode of the invention, the lower layer is photosensitive and in this case is preferably composed of a positive photoresist, based on polyglutarimide or polybenzoxazole.

In accordance with a concomitant mode of the invention, the upper layer is likewise advantageously a photoresist. This layer is preferably composed of a positive photoresist (positive resist) based on Novolak/diazoquinone, or is composed of a negative photoresist (negative resist) based on Novolak/photo-acid. Poly(methylmethacrylate) (PDMA), poly(methyliso-propylketone) (PMIPK) and so-called chemically amplified systems on a poly-(p-hydroxystyrol) base with tertiary butoxycarbonyl protection groups (t-BOC groups) can also be used as the positive resist. Poly(silphenylene-siloxanes) can also be used, for example, as the negative resist.

Alternatively, it is possible to structure the upper layer indirectly. Amorphous carbon (a-C) or amorphous carbon containing hydrogen (a-C:H) is then used, for example, as the layer material for this purpose. Such layers are structured in an oxygen plasma, with an etching mask in the form of a photoresist layer containing silicon being used, in particular a so-called CARL resist (CARL=Chemical Amplification of Resist Lines) or a TSI system (TSI=Top Surface Imaging). After structuring, the upper layer advantageously has a larger structure width than the lower layer. The difference in the structure width ("overhang") in this case is advantageously between 0.1 and 50 $\mu$m, in particular between 1 and 10 $\mu$m. The thickness of the lower layer is preferably 0.1 to 30 $\mu$m, in particular 0.5 to 10 $\mu$m, and that of the upper layer is 0.1 to 30 $\mu$m, in particular 0.5 to 5 $\mu$m.

A major advantage of the method according to the invention is that it can be used both for pixel displays and for symbols ("icons") of any desired shape. For example, an electroluminescent display may thus be composed of a central region with individual pixels disposed in lines and columns and surrounded by a row of symbols. Further advantages include the following:

It is possible to dispense with the use of shadow masks for structuring deposition of the (metallic) top electrode. This avoids a high-cost process step that is subject to faults.

The processes required to remove a portion of the metal electrode are avoided. There is therefore no risk of the organic functional layers being damaged by plasma processes or by the influence of solvents. Furthermore, a high level of process reliability and stability are achieved, and more advantageous costs can be achieved as a result of the increase in the yield.

The metal electrode may be deposited over a large area. The parts which are deposited on the intermediate spaces between the actual conductor tracks do not need to be removed since there is no electrically conductive connection between the actual conductor tracks and the metal in the intermediate spaces.

In comparison with structuring of the metal electrode through the use of a single photoresist layer, there is a major advantage in that the achievable "undercutting" in the case of a two-layer configuration is considerably greater than in the case of a configuration with only one layer. The probability of an electrical short-circuit between two adjacent metallic conductor tracks, which would lead to failure of the display, is thus considerably lower.

Other features which are considered as characteristic for the invention are set forth in the appended claims.

Although the invention is illustrated and described herein as embodied in a method for producing organic electroluminescent components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a diagrammatic, cross-sectional view, which is not to scale, of an organic light-emitting diode produced by using the method according to the invention.

DESCRIPTION OF THE PREFERRED EMBODIMENTS

Referring now in detail to the single FIGURE of the drawing, there is seen a transparent, structured bottom electrode 2 which is located on a substrate 1. The substrate 1, which may have non-planar geometry, is composed, for example, of glass, of metal, such as silicon, or of a polymer (in the form of a film). The bottom electrode 2 is, for example, an ITO electrode (ITO=Indium Tin Oxide). Subsequent layers are a lower photoresist layer 3, an upper photoresist layer 4 and an organic functional layer 5. A structured top electrode 6 (metal electrode) is then located on the organic functional layer 5. A portion 6b of the electrode 6 overlies the organic functional layer 5 and the lower photoresist layer 3 and the upper photoresist layer 4. A portion 6a of the electrode overlies the organic functional layer 5.

The materials for the organic functional layers may be vapor-deposited simultaneously from a plurality of evaporator sources which are disposed at a suitable distance from one another during the production of the configuration illustrated diagrammatically in the FIGURE. The metal electrode is then applied subsequently. Furthermore, a distance between an evaporator source and the substrate during the deposition of the organic functional layers may be different than a distance between the evaporator source and the substrate during the deposition of the metal electrode. Additionally, the substrate can be moved during the deposition of the organic functional layers, while it is held In its position during the deposition of the metal electrode.

EXAMPLE 1

Production of an OLED Display with a Photosensitive First Layer

The production of the display includes the following process steps:

1. A glass plate coated over the entire surface with indium tin oxide (ITO) is structured with the aid of a photolithographic method with subsequent wet-chemical etching in such a manner that parallel conductor tracks are produced, with a width.of about 200 $\mu$m and an intermediate space of about 50 $\mu$m. The conductor tracks are each about 2 cm long and, if required, have additives at their outer end for making contact. The photoresist which is used for the structuring is removed completely.

2. The glass plate is heated for about 1 hour at a temperature of 250° C., and a commercial photoresist based on polyglutarimide is then centrifuged on (applied for 10 s at 700 rpm, centrifuging for 30 s at 4000 rpm). The layer that is obtained is dried on a hotplate at 250° C. for 170 s. It is then floodlit at a wavelength of 248 nm (polychromatically) with a dose of 1000 mJ/cm$^2$. A commercial photoresist based on Novolak/diazoquinone (10:1 thinned with (1-methoxy-2-propyl)-acetate) is then subsequently centrifuged on at 2000 rpm for 20 s. The two layers are dried at 100° C. for 60 s and are then exposed with a dose 62 mJ/cm$^2$ at a wavelength di 365 nm (polychromatically) through a lithography mask. Developing is then carried out using a commercial developer containing tetramethylammioniumhydroxide for 40 to 80 s, depending on the desired overhang of the upper layer. For example, an overhang of about 10 $\mu$m is produced with a development time of 60 s. The layer thickness of the lower layer is about 900 nm. The two layers together are about 2.6 $\mu$m thick. Photoresist residue is then removed from the ITO surface through the use of an oxygen plasma (RF power: 500 W, gas flow: 30 sccm) for 20 s.

3. A layer composed of N,N'-bis(3-methylphenyl)-N,N'-bis (phenyl)-benzidine (m-TPD) is applied by conventional thermal vapor deposition at a pressure of 10$^{-5}$ mbar (layer thickness: 135 nm, vapor deposition rate: 0.2 nm/s). A layer composed of hydroxyquinoline aluminum (HII) salt (Alq) is then applied, with a thickness of 65 nm, by thermal vapor deposition (vapor deposition rate: 0.2 nm/s), without changing the pressure, that is to say without ventilating the vacuum receptor.

4. A layer thickness of 100 nm of magnesium is applied to the active surface of the display by thermal vapor deposition (deposition rate: 1 nm/s, pressure: 10$^{-5}$ mbar), without using a mask. A Layer thickness of 100 nm of silver is then applied, likewise by thermal vapor deposition, without breaking the vacuum, onto the active display area (deposition rate: 1 nm/s, pressure: 10$^{-5}$ mbar)

The display illuminates in such a way that it is clearly visible even in bright daylight and in sunshine, and the emission color is greeny-yellow.

EXAMPLE 2

Production of an OLED Display with a Non-photosensitive First Layer

The production of the display includes the following process steps:
1. A glass plate coated over the entire surface with indium tin oxide (ITO) is structured with the aid of a photolithographic method with subsequent wet-chemical etching in such a manner that parallel conductor tracks are produced, with a width of about 200 μm and an intermediate space of about 50 μm. The conductor tracks are each about 2 cm long and, if required, have additives at their outer end for making contact. The photoresist used for the structuring is removed completely.
2. The glass plate is heated for about 1 hour at a temperature of 250° C. and a commercial non-photosensitive polyimide is then centrifuged on at 5000 rpm for 30 s. The layer which is obtained is dried on a hotplate at 100° C. for 90 s (layer thickness: 10 μm). A commercial photoresist based on Novolak/diazoquinone (10:1 thinned with (1-methoxy-2-propyl)-acetate) then subsequently centrifuged on at 2000 rpm for 20 s. The two layers are dried for 60 s at 100° C. and are then exposed with a dose of 62 mJ/cm$^2$ at a wavelength of 365 nm (polychromatically) through a lithography mask. Developing is then carried out for 60 s, using a commercial developer containing tetramethylammioniumhydroxide. The polyimide is then etched using an etching solution based on cyclohexanol, isopropanol and ethanolamine. An etching duration of about 1 min is required per 2 μm of underetching. Varnish residue is then removed from the ITO surface through the use of an oxygen plasma (RT power: 500 W, gas slow: 30 sccm) for 20 s.
3. A layer composed of N,N'-bis(3-methylphenyl)-N,N'-bis(phenyl)-benzidine (m-TPD) is then applied by conventional thermal vapor deposition at a pressure of $10^{-5}$ mbar (layer thickness: 135 nm, vapor-deposition rate: 0.2 nm/s). A layer composed of hydroxyquinoline aluminum (III) salt (Alq) is then applied, with a thickness of 65 nm, by thermal vapor deposition (vapor deposition rate: 0.2 nm/s), without changing the pressure, that is to say without ventilating the vacuum receptor.
4. A layer thickness of 100 nm of magnesium is applied to the active surface of the display by thermal vapor deposition (deposition rate: 1 nm/s, pressure: $10^{-5}$ mbar), without using a mask. A layer thickness of 100 nm of silver is then applied, likewise by thermal vapor deposition, onto the active display area (deposition rate: 1 nm/s, pressure: $10^{-5}$ mbar), without breaking the vacuum.

The display illuminates in such a way that it is clearly visible even in bright daylight and in sunshine, and the emission color is greeny-yellow.

EXAMPLE 3

Production of organic light-emitting diodes according to the prior art and according to the invention Two samples are produced, one using a conventional shadow mask (sample A) and the other using the method according to the invention (sample B)

SAMPLE A 2 mm-wide ITO conductor tracks are produced photolithographically in a known manner on a glass plate coated with indium tin oxide. A 135 nm thick layer composed of N,N'-bis(3-methylphenyl)-N,N'-bis(phenyl)-benzidine (m-TPD) is subsequently deposited at a pressure of $10^{-5}$ mbar. A 65 nm-thick layer composed of hydroxyquinoline aluminum (III) salt (Alq) is then deposited, without breaking the vacuum. In this case the two layers are produced by thermal vapor deposition ("physical vapor deposition", PVD) (deposition rate: 0.2 nm/s in each case). A 100 nm-thick magnesium layer followed by a 100 nm thick silver layer are then deposited through a shadow mask in such a manner that 2 mm wide metallic conductor tracks are produced (pressure: $10^{-5}$ mbar, deposition rate: 1 nm/s) The metallic conductor tracks run at right angles to the conductor tracks composed of indium tin oxide, so that as a result of this configuration, the active, emitting area of the organic LED is 2×2 mm$^2$.

SAMPLE B 2 mm-wide ITO conductor tracks are produced photolithographically in a known manner on a glass plate coated with indium tin oxide. The glass plate s heated for about 1 hour at a Temperature of 250° C. and a commercial photoresist based on polyglutarimide is then centrifuged on (application for 10 s at 700 rpm, centrifuging for 30 s at 4000 rpm). The layer which is obtained is dried on a hotplate at 250° C. for 170 s. It is then floodlit at a wavelength of 248 nm (polychromatically) with a dose of 1000 mJ/cm$^2$. A commercial photoresist based on Novolak/diazoquinone (10:1 thinned with (1-methoxy-2-propyl)-acetate) is subsequently centrifuged on at 2000 rpm for 20 s. The two layers are dried at 100° C. for 60 s and are then exposed with a dose of 62 mJ/cm$^2$ at a wavelength of 365 nm (polychromatically) through a lithography mask. Developing is then carried out using a commercial developer containing tetramethylammoniumhydroxide for 40 to 80 s, depending on the desired overhang of the upper layer. For example, an overhang of about 10 μm is produced with a development time of 60 s. The layer thickness of the lower layer is about 900 nm and the two layers together are about 2.6 μm thick. Photoresist residue is then removed from the ITO surface through the use of an oxygen plasma (RF power: 500 W, gas flow: 30 sccm) for 20 s. A 135 nm-thick layer composed of N,N'-bis(3-methylphenyl)-N,N'-bis(phenyl)-benzidine (m-TPD) is then subsequently deposited at a pressure of $10^{-5}$ mbar. A 65 nm-thick layer composed of hydroxyquinoline aluminum (III) salt (Alq) is then deposited, without breaking the vacuum. In this case, both layers are produced by thermal vapor deposition ("physical vapor deposition", PVD) (deposition rate: 0.2 nm/s in each case). Magnesium followed by silver are then deposited over the surface (pressure: $10^{-5}$ mbar, deposition rate: 1 nm/s, thickness: 100 nm in each case), without using a shadow mask. 2 mm wide metallic conductor tracks are produced in this case due to the existing configuration of two structured photoresist layers. The metallic conductor tracks run at right angles to the conductor tracks composed of indium tin oxide, so that as a result of this configuration, the active, emitting area of the organic LED is 2×2 mm$^2$.

A comparison of the emitted light intensity as a function of the required current density for sample A and sample B shows that the method according to the invention allows organic light-emitting diodes to be produced which have no disadvantages over those which are produced according to the known prior art. However, as already stated, they have considerable advantages.

We claim:
1. A method of fabricating organic electroluminescent components, which comprises:
   providing a substrate having a bottom electrode formed on a surface of the substrate;

depositing a first photosensitive layer on the substrate over the bottom electrode;

depositing a second photosensitive layer on the first photosensitive layer, the first photosensitive layer having a higher development rate in a developer than the second photosensitive layer, and the second photosensitive layer not damaging the first photosensitive layer;

maintaining a boundary between the first photosensitive layer and the second photosensitive layer;

selectively exposing the second photosensitive layer with an exposure source;

developing the first and second photosensitive layers to form structures of which a width of the first photosensitive layer is less than a width of the second photosensitive layer to form an overhang in the structures as a result of the higher development rate of the first photosensitive layer in the developer;

forming at least one organic electroluminescent layer in areas between the structures;

depositing a top electrode over the substrate, the top electrode being defined into distinct first and second portions by the overhang, the first portions being formed in areas between the structures to serve as top electrodes, and the second portions being formed over the structures;

selecting a composition of the first photosensitive layer that is soluble in a first solvent; and selecting a composition of the second photosensitive layer that is soluble in a second solvent, the first solvent not dissolving the composition of the second photosensitive layer and the second solvent not dissolving the composition of the first photosensitive.

2. The method of claim 1, wherein the substrate is transparent.

3. The method of claim 2, wherein the bottom electrode is transparent and conductive.

4. The method of claim 3, wherein the bottom electrode includes bottom conductive rails in a first direction.

5. The method of claim 4, wherein the first portions are top conductive rails traversing the bottom conductive rails.

6. The method of claim 2 wherein the bottom electrode includes bottom conductive rails in a first direction.

7. The method of claim 6, wherein the first portions are top conductive rails traversing the bottom conductive rails.

8. The method of claim 1, wherein the bottom electrode is a transparent and conductive material.

9. The method of claim 8, wherein the bottom electrode includes bottom conductive rails in a first direction.

10. The method of claim 9, wherein the first portions are top conductive rails traversing the bottom conductive rails.

11. The method of claim 1 wherein the bottom electrode includes bottom conductive rails in a first direction.

12. The method of claim 11 wherein the first portions of the structures define top conductive rails traversing the bottom conductive rails.

13. The method according to claim 12, wherein the second photosensitive layer is a negative photosensitive layer.

14. A method of fabricating organic electroluminescent components, which comprises:

providing a transparent substrate having a transparent conductive bottom electrode formed on a surface of the substrate, the bottom electrode having bottom conductive rails in a first direction;

depositing a first photosensitive layer on the substrate over the bottom electrode;

depositing a second photosensitive layer on the first photosensitive layer, the second photosensitive layer not damaging the first photosensitive layer, the first photosensitive layer developing faster in a developer than the second photosensitive layer, and the first photosensitive layer being a positive photosensitive layer;

maintaining a boundary between the first and second photosensitive layers;

selectively exposing the second photosensitive layer with an exposure source;

developing the first and second photosensitive layers to form structures of which a width of the first photosensitive layer is less than a width of the second photosensitive layer to form an overhang in the structures as a result of the higher development rate of the first photosensitive layer in the developer;

forming at least one organic electroluminescent layer in areas between the structures;

depositing a top electrode over the substrate, the top electrode having first and second portions, the first portions being formed in areas between the structures to serve as top electrodes and the second portions being formed over the structures, the first portions being configured into top conductive rails that traverse the bottom conductive rails; selecting a composition of the first photosensitive layer that is soluble in a first solvent; and selecting a composition of the second photosensitive layer that is soluble in a second solvent, the first solvent not dissolving the composition of the second photosensitive layer and the second solvent not dissolving the composition of the first photosensitive.

15. The method of claim 14, wherein the first and second layers are developed in the developer.

16. The method of claim 14 further comprising:
exposing the first photosensitive layer to activation radiation prior to depositing the second photosensitive layer.

17. The method of claim 14, wherein the first layer contains photoresist.

18. The method of claim 17, wherein the first and second layers are developed in the developer.

19. The method of claim 17 further comprising:
exposing the first photosensitive layer to activation radiation prior to depositing the second photosensitive layer.

20. The method of claim 19 wherein the first and second layers are developed in the developer.

21. The method of claim 17, wherein the second photosensitive layer is chosen from the group of photosensitive layers consisting of a positive photosensitive layer and a negative photosensitive layer.

22. The method of claim 21 further comprising: exposing the first photosensitive layer to activation radiation prior to depositing the second photosensitive layer.

23. The method of claim 22 wherein the first and second layers are developed in the developer.

24. The method of claim 21 wherein the first and second layers are developed in the developer.

25. The method of claim 14 wherein the second photosensitive layer is chosen from the group of photosensitive layers consisting of a positive photosensitive layer and a negative photosensitive layer.

26. The method of claim 25 further comprises exposing the first photosensitive layer to activation radiation prior to depositing the second photosensitive layer.

27. The method of claim 26 wherein the first and second layers are developed in the developer.

28. The method of claim 25 wherein the first and second layers are developed in the developer.

29. A method of fabricating organic electroluminescent components, which comprises:

provinding a transparent substrate having a transparent conductive bottom electrode formed on a surface of the substrate, the bottom electrode having bottom conductive rails in a first direction;

depositing a first photosensitive layer on the substrate over the bottom electrode;

depositing a second photosensitive layer on the first photosensitive layer, the first photosensitive layer developing faster in a developer than the second photosensitive layer, the second photosensitive layer being chosen from the group of photosensitive layers consisting of a positive photosensitive layer and a negative photosensitive layer, and the second photosensitive layer not damaging the first photosensitive layer;

maintaining a boundary remaining between the first and second photosensitive layers;

selectively exposing the second photosensitive layer with an exposure source;

developing the first and second photosensitive layers to form structures of which a width of the first photosensitive layer is less than a width of the second photosensitive layer to form an undercut in the structures as a result of the higher development rate of the first photosensitive layer in the developer;

forming at least one organic electroluminescent layer in areas between the structures;

depositing a top electrode over the substrate, the top electrode forming distinct first and second portions, the first portions being formed in areas between the structures to serve as top electrodes and the second portions being formed over the structures, the first portions being configured into top conductive rails that traverse the bottom conductive rails;

selecting a composition of the first photosensitive layer that is soluble in a first solvent; and selecting a composition of the second photosensitive layer that is soluble in a second solvent, the first solvent not dissolving the composition of the second photosensitive layer and the second solvent not dissolving the composition of the first photosensitive.

30. The method of claim 29 further comprising:

exposing the first photosensitive layer to activation radiation prior to depositing the second photosensitive layer.

31. The method of claim 30, wherein the first and second layers are developed in the developer.

32. The method of claim 29, wherein the first layer comprises photoresist.

33. The method of claim 32 further comprising:

exposing the first photosensitive layer to activation radiation prior to depositing the second photosensitive layer.

34. The method of claim 33, wherein the first and second layers are developed in the developer.

35. The method of claim 32, wherein the first and second layers are developed in the developer.

36. The method of claim 29, wherein the first and second layers are developed in the developer.

37. A method of fabricating organic electroluminescent components comprising:

providing a substrate having a bottom electrode formed on a surface of the substrate;

depositing a first photosensitive layer on the substrate over the bottom electrode;

depositing a second photosensitive layer on the first photosensitive layer, the first photosensitive layer having a higher development rate in a developer than the second photosensitive layer, and the second photosensitive layer being a negative photosensitive layer and not damaging the first photosensitive layer;

maintaining a boundary between the first photosensitive layer and the second photosensitive layer;

selectively exposing the second photosensitive layer with an exposure source;

developing the first and second photosensitive layers to form structures of which a width of the first photosensitive layer is less than a width of the second photosensitive layer to form an overhang in the structures as a result of the higher development rate of the first photosensitive layer in the developer;

forming at least one organic electroluminescent layer in areas between the structures; and depositing a top electrode over the substrate, the top electrode being defined into distinct first and second portions by the overhang, the first portions being formed in areas between the structures to serve as top electrodes, and the second portions being formed over the structures.

* * * * *